United States Patent
Mino et al.

(10) Patent No.: US 8,624,408 B2
(45) Date of Patent: Jan. 7, 2014

(54) CIRCUIT DEVICE AND METHOD OF MANUFACTURING THE SAME

(75) Inventors: Katsuyoshi Mino, Ota (JP); Masaru Kanakubo, Ota (JP); Akira Iwabuchi, Chiba (JP); Masami Motegi, Gunma (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 40 days.

(21) Appl. No.: 13/189,121

(22) Filed: Jul. 22, 2011

(65) Prior Publication Data

US 2012/0018906 A1 Jan. 26, 2012

(30) Foreign Application Priority Data

Jul. 22, 2010 (JP) .................. 2010-164996

(51) Int. Cl.
*H01L 23/29* (2006.01)
(52) U.S. Cl.
USPC ........................................................ 257/790
(58) Field of Classification Search
USPC .............................. 257/789, 790
See application file for complete search history.

(56) References Cited

U.S. PATENT DOCUMENTS

2005/0263880 A1 12/2005 Igarashi et al.
2010/0065960 A1* 3/2010 Mino et al. .................... 257/693

FOREIGN PATENT DOCUMENTS

| CN | 1705105 | 12/2005 |
|---|---|---|
| CN | 101714534 | 5/2010 |
| JP | 2003-017515 | 1/2003 |
| JP | 2006-100535 | 4/2006 |
| JP | 2006-261299 | 9/2006 |
| JP | 2010-067852 | 3/2010 |
| JP | 2010-109246 | 5/2010 |

* cited by examiner

*Primary Examiner* — Jenny L Wagner
(74) *Attorney, Agent, or Firm* — Morrison & Foerster LLP

(57) ABSTRACT

In a circuit device of the present invention, the lower surface side of a circuit board and part of side surfaces thereof are covered with a second resin encapsulant, and the upper surface side and the like of the circuit board are covered with a first resin encapsulant. Since heat dissipation to the outside of the circuit device is achieved mainly through the second resin encapsulant, a particle size of filler contained in the second resin encapsulant is made larger than a particle size of filler contained in the first resin encapsulant. Heat dissipation to the outside of the circuit device is greatly improved.

11 Claims, 10 Drawing Sheets

CIRCUIT DEVICE AND METHOD OF MANUFACTURING THE SAME

This application claims priority from Japanese Patent Application Number JP 2010-164996 filed on Jul. 22, 2010, the content of which is incorporated herein by reference in its entirety.

BACKGROUND OF THE INVENTION

1. Field of the Invention

The present invention relates to a circuit device which improves the heat dissipation of a resin package, and a method of manufacturing the same.

2. Description of the Related Art

As one example of a conventional method of manufacturing a circuit device, the following manufacturing method has been known. As shown in FIG. 9A, a circuit board 71 made of a metal substrate such as an Al substrate is prepared, and an insulative resin layer 72 and a conductive pattern 73 are formed on an upper surface of the circuit board 71. Further, circuit elements 74 and leads 75 are electrically connected to the top of the conductive pattern 73 to form a hybrid integrated circuit on the circuit board 71. Then, the circuit board 71 is placed in a cavity 77 of a resin encapsulation mold 76, and the leads 75 are clamped between an upper mold half 78 and a lower mold half 79. Thus, the circuit board 71 is fixed in the cavity 77.

As shown in FIG. 9B, resin is injected into the cavity 77 through a gate portion 80 of the resin encapsulation mold 76. At this time, as indicated by an arrow 81, the injected resin collides against a side surface of the circuit board 71 first. The resin flows to the upper and lower surface sides of the circuit board 71 as indicated by arrows 81A and 81B. Further, a curved surface 82 is disposed at an edge portion of the lower surface of the circuit board 71, and therefore the resin is allowed to efficiently flow to the lower surface side of the circuit board 71. Although the thickness of a resin encapsulant under the lower surface of the circuit board 71 is, for example, approximately 0.5 mm, the aforementioned resin injecting method enables the narrow gap to be filled with the resin. This technology is described for instance in Japanese Patent Application Publication No. 2003-17515 (pages 6 to 9, and FIGS. 8 and 9).

Moreover, as one example of a conventional circuit device, the following structure has been known. As shown in FIG. 10, in a circuit device 91, a hybrid integrated circuit including a conductive pattern 93 and circuit elements 94 is constructed on an upper surface of a circuit board 92, and the upper, side, and lower surfaces of the circuit board 92 are integrally covered with a resin encapsulant 95. Further, the resin encapsulant 95 includes a first resin encapsulant 95A formed by transfer molding and a second resin encapsulant 95B formed by melting a solid resin sheet. It should be noted that as shown in the drawing, from side surfaces of the resin encapsulant 95, leads 96 electrically connected to the conductive pattern 93 on the upper surface of the circuit board 92 are led out of the resin encapsulant 95. This technology is described for instance in Japanese Patent Application Publication No. 2010-67852 (pages 4 to 10, and FIGS. 1 to 4).

First, in the manufacturing method described with reference to FIGS. 9A and 9B, the resin injected through the gate portion 80 of the resin encapsulation mold 76 collides against a side surface of the circuit board 71, and the utilization of the curved surface 82 formed in the circuit board 71 makes it easy to fill a narrow region under the lower surface of the circuit board 71 with the resin. Further, to prevent the formation of an incompletely filled region in the narrow region under the lower surface of the circuit board 71, a width enough to allow the flow of the resin is needed. Thus, there is the problem that it is difficult to realize a reduction in the thickness of the resin encapsulant under the lower surface of the circuit board 71, and to improve the heat dissipation from the resin encapsulant.

In particular, conceivable ways to solve this problem of heat dissipation include increasing the filler content in resin for encapsulation and increasing the particle size of the filler. However, increasing the filler content or increasing the particle size thereof causes another problem that the flowability of the resin deteriorates to make an incompletely filled region more likely to be formed under the lower surface of the circuit board 71. Furthermore, with regard to the material and shape of the filler used, manufacturing methods in which all the surfaces of the circuit board 71 are integrally encapsulated in a single type of resin also have problems such as damage to circuit elements and breakage of fine metal wires, thus having the problem that the material and shape thereof are limited.

Next, in the circuit device 91 described with reference to FIG. 10, though an incompletely filled region is prevented from being formed under the lower surface of the circuit board 92, and a reduction in the thickness of the resin encapsulant is realized, no disclosure is made with regard to a structure for further improving heat dissipation.

Moreover, a region indicated by a circle 97 represents a polymerized region of the first resin encapsulant 95A and the second resin encapsulant 95B. As shown in the drawing, the second resin encapsulant 95B is formed to extend to the side surfaces of the circuit board 92 to such an extent to cover a lower end portion of the circuit board 92. Further, the polymerized region is prone to have a lower withstand voltage characteristic than single-material regions of the respective first and second resin encapsulants 95A and 95B. Accordingly, there is the problem that the circuit board 92 is short-circuited through the polymerized region when the polymerized region is located under the lower surface of the circuit board 92 or on lower portions of the side surfaces of the circuit board 92.

Further, if a reduction in the thickness of the second resin encapsulant 95B is realized to improve the heat dissipation of the circuit device 91, the percentage of the film thickness of the first resin encapsulant 95A to the thickness of the entire resin encapsulant 95 increases. Accordingly, there is the problem that the circuit board 92 is prone to warpage due to the shrinkage force of first resin encapsulant when the first resin encapsulant 95A is thermally cured in the resin encapsulation mold.

SUMMARY OF THE INVENTION

The present invention has been made in view of the aforementioned circumstances. A circuit device of the present invention is a circuit device including a circuit board, a conductive pattern provided on the side of one main surface of the circuit board, a circuit element fixed on the conductive pattern, and a resin encapsulant covering the circuit board. The circuit board has the one main surface, other main surface opposite to the one main surface, and a side surface located between the one main surface and the other main surface. The resin encapsulant includes a first resin encapsulant covering at least the side of the one main surface of the circuit board and part of the side surface thereof and a second resin encapsulant covering at least the side of the other main surface of the circuit board and part of the side surface thereof. A polymerized region of the first resin encapsulant and the second resin encapsulant is located to extend beside the side surface of the circuit board, and a top portion of the polymerized region is located at a position lower than the side of an upper surface of the circuit board.

Moreover, a method of manufacturing a circuit device of the present invention is a method of manufacturing a circuit device in which a circuit board having a circuit element disposed on the side of one main surface thereof is placed in a resin encapsulation mold and in which a first encapsulating resin is injected into a cavity of the resin encapsulation mold to form a resin encapsulant. The method includes the steps of preparing a resin sheet formed by pressing a powdery resin material containing a thermosetting resin and placing the resin sheet in the cavity of the resin encapsulation mold so that the circuit board may be mounted on the resin sheet, and forming the resin encapsulant in such a manner that, the second encapsulating resin covers the side of other main surface of the circuit board, which is opposite to the one main surface, and part of a side surface of the circuit board, which is located between the one main surface and the other main surface, and the first encapsulating resin injected into the cavity covers the side of the one main surface of the circuit board and part of the side surface of the circuit board, while the first encapsulating resin and the second encapsulating resin are polymerized beside the side surface.

DESCRIPTION OF THE INVENTIONS

Hereinafter, a circuit device according to a first embodiment of the present invention will be described. FIG. 1B is a cross-sectional view of a circuit device shown in FIG. 1A, which is taken along line A-A. FIG. 2A is a perspective view for explaining a resin sheet. FIG. 2B is a cross-sectional view for explaining the resin sheet.

Figure 1A:
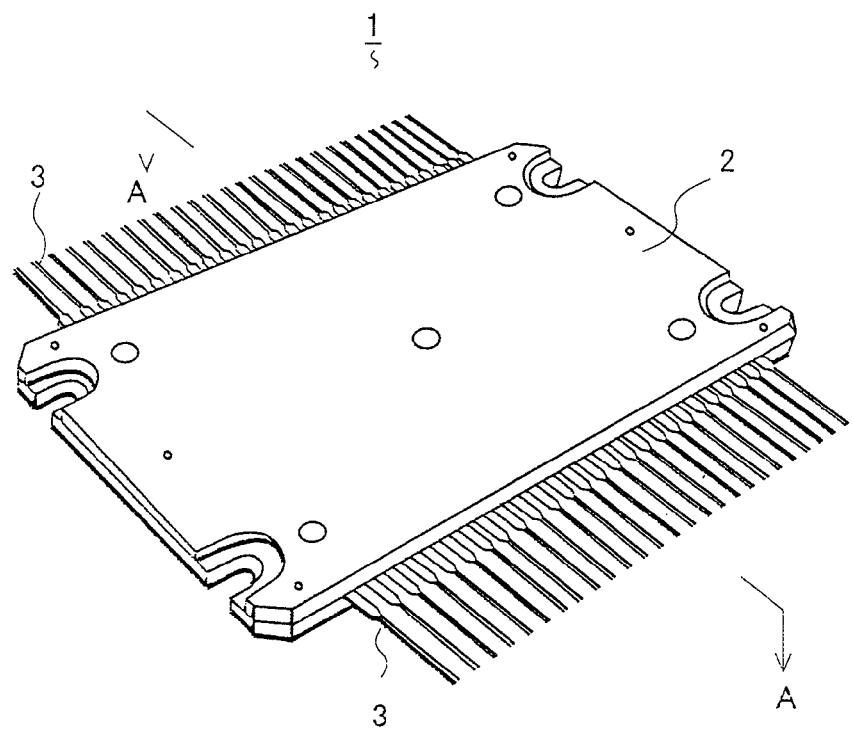
FIGS. 1A and 1B are a perspective view and a cross-sectional view for explaining a circuit device in an embodiment of the present invention, respectively.
Figure 1B:
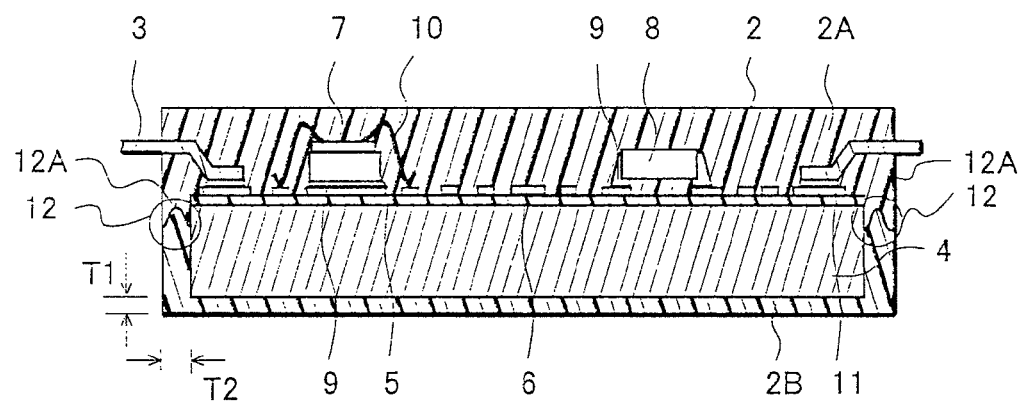
Figure 2A:
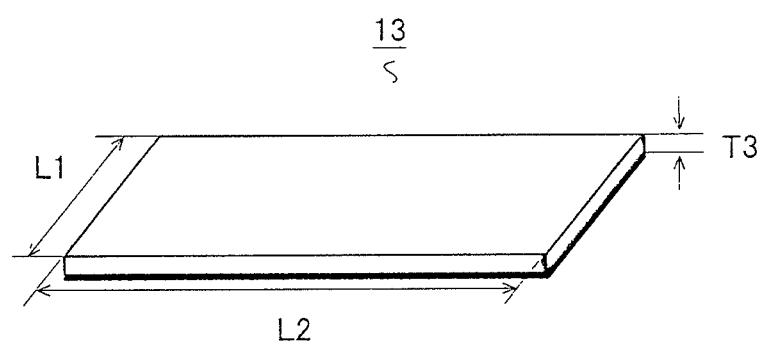
FIGS. 2A and 2B are a perspective view and a cross-sectional view for explaining the circuit device in the embodiment of the present invention, respectively.
Figure 2B:
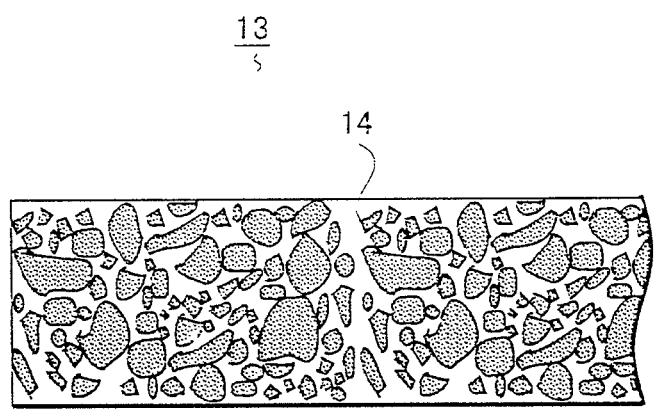

FIG. 1A shows a perspective view of a circuit device 1. In the circuit device 1, a hybrid integrated circuit including a conductive pattern 6 (see FIG. 1B) and circuit elements is constructed on an upper surface of a circuit board 4 (see FIG. 1B) in a resin encapsulant 2, and leads 3 connected to this circuit are led out of the resin encapsulant 2. Further, the upper, side, and lower surfaces of the circuit board 4 are covered with the resin encapsulant 2 made of a thermosetting resin.

As shown in FIG. 1B, the circuit board 4 is a substrate made of metal such as aluminum or copper, and has, for example, a shape in which length×width×thickness=approximately 61 mm×42.5 mm×1.5 mm. Here, a material other than metal may be employed as the material of the circuit board 4. For example, a ceramic or a resin material may be employed.

An insulating layer 5 is formed to cover the entire region of a surface of the circuit board 4. The insulating layer 5 is made of an epoxy resin highly filled with filler. Further, the conductive pattern 6 is formed such that a predetermined circuit is realized on the upper surface of the insulating layer 5. The conductive pattern 6 is made of a metal film of, for example, copper or the like, and the thickness thereof is approximately 50 μm.

A semiconductor element 7 and a chip element 8 constituting the circuit elements are fixed at predetermined positions on the conductive pattern 6 with an adhesive 9 such as solder. Further, the semiconductor element 7 and the conductive pattern 6 are connected through fine metal wires 10. Here, a transistor, an LSI chip, a diode, or the like is employed as the semiconductor element 7. A chip resistor, a chip capacitor, or the like is employed as the chip element 8. It should be noted that as shown in the drawing, a heat sink may be disposed between the semiconductor element 7 and the conductive pattern 6.

The leads 3 are fixed to pads 11 provided in a peripheral portion of the circuit board 4, and function as external connection terminals through which input signals and output signals pass. Further, as shown in FIG. 1A, a large number of leads 3 are disposed along two opposite side edges of the circuit board 4 in the longitudinal direction. It should be noted that the pads 11 constitute part of the conductive pattern 6.

The resin encapsulant 2 includes a first resin encapsulant 2A and a second resin encapsulant 2B. A region indicated by circles 12 is a polymerized region (region in which resins are mixed and in which sufficient bonding strength can be obtained) of the first resin encapsulant 2A and the second resin encapsulant 2B, and the resin encapsulants 2A and 2B are integrated in this region. This polymerized region is a region in which a withstand voltage characteristic tends to be slightly lower than a region in which the first resin encapsulant 2A or the second resin encapsulant 2B is singly formed. Further, in the case where this polymerized region is located on the lower surface side of the circuit board 4 and in the vicinities of lower end portions of the side surfaces thereof, and where the circuit device 1 is mounted on the upper surface of a heat sink, the circuit board 4 and the heat sink are short-circuited through this polymerized region.

Accordingly, in this embodiment, this polymerized region is located above the centers of the side surfaces of the circuit board 4. Thus, the circuit board 4 is prevented from being short-circuited to external members through this polymerized region. Moreover, as indicated by the circles 12, the second resin encapsulant 2B on the side surfaces of the circuit board 4 is cured to protrude toward the upper surface side of the circuit board 4. Further, the size and thickness of a resin sheet 13 are adjusted so that a top portion 12A of the second resin encapsulant 2B may be lower than the upper surface (including the surface of the insulating layer 5) of the circuit board 4. This structure prevents the resin constituting the second resin encapsulant 2B from moving around to the upper surface side of the circuit board 4, and prevents the moisture resistance on the upper surface side of the circuit board 4 from being deteriorated by alumina contained in the resin. Further details will be described later. Moreover, the size and shape of alumina prevent damage to the circuit elements and breakage and the like of fine metal wires.

Further, the first resin encapsulant 2A is formed by injecting melted resin into a cavity of a resin encapsulation mold. The first resin encapsulant 2A covers the circuit elements such as the semiconductor element 7, connecting portions of the leads 3, and the upper surface and part (upper portion of the circuit board 4) of the side surface of the circuit board 4.

On the other hand, the second resin encapsulant 2B is formed by melting the resin sheet 13 (see FIG. 2A) placed under the lower surface of the circuit board 4. The second resin encapsulant 2B covers the lower surface of the circuit board 4, and further covers to upper portions, which are indicated by the circles 12, of the side surfaces of the circuit board 4. Further, the second resin encapsulant 2B under the lower surface of the circuit board 4 has a thickness T1 of, for example, not less than 0.1 mm nor more than 0.3 mm to form a very thin film. Moreover, the second resin encapsulant 2B at the side surfaces of the circuit board 4 also has a thickness T2 of, for example, not more than 1.0 mm to form a thin film. Since the second resin encapsulant 2B contains alumina, which has excellent thermal conductivity, and has small thicknesses T1 and T2 to form a thin film, the thermal resistance in the second resin encapsulant 2B is reduced. Further details will be described later. Further, heat radiated from the circuit elements such as the semiconductor element 7 is favorably radiated outside the circuit device 1 through the circuit board 4 and the second resin encapsulant 2B.

As shown in FIG. 2A, the resin sheet 13 is formed in the shape of a sheet by molding a granular, powdered resin having a thermosetting resin as the main ingredient thereof by compression molding (tableting). An epoxy resin, ortho-cresol novolac/biphenyl, dicyclopentadiene, or the like is employed as the powdered resin. Further, filler is mixed in the powdered resin. With regard to the type of the filler, alumina is employed. Crystalline silica, crushed silica, fused silica, or silicon nitride may be employed to be mixed with alumina.

The two-dimensional size (L1×L2) of the resin sheet 13 depends on the type of the circuit device 1 in which the resin sheet 13 is used. The resin sheet 13 has a size similar to that of the circuit board 4 to be used or is slightly larger than the circuit board 4. On the other hand, the thickness T3 of the resin sheet 13 is, for example, not less than 0.1 mm nor more than 0.8 mm.

As shown in FIG. 2B, the resin sheet 13 is made of a powdered resin 14 including a large number of particles. This powdered resin 14 is made of a thermosetting resin, such as an epoxy resin, which has an additive such as filler added thereto. The diameter of each particle of the powdered resin 14 is, for example, not more than 1.0 mm. Further, in the resin sheet 13, the packing fraction (the fraction of the space occupied by the powdered resin 14 in the total volume of the resin sheet 13) of the powdered resin 14 is not less than 99%. Thus increasing the packing fraction of the resin sheet 13 reduces the occurrence of voids in the second resin encapsulant 2B formed by the melting of the resin sheet 13.

As described previously, first, the first resin encapsulant 2A is formed by injecting melted resin into the cavity of the resin encapsulation mold. Further, it is necessary to prevent the hard filler contained in the resin from colliding against the circuit elements and the fine metal wires at the time of resin injection and causing damage to the circuit elements and wire sweep and breakage of the fine metal wires. Accordingly, spherical filler is used as the filler contained in the resin which forms the first resin encapsulant 2A, and the particle size thereof is up to approximately 75 μm.

Further, the first resin encapsulant 2A mainly covers the upper surface side of the circuit board 4, and is required to have moisture resistance for the purposes such as the prevention of corrosion of the fine metal wires rather than heat dissipation. Accordingly, silica, which has excellent moisture resistance, is used as the filler. Since the materials cost of silica is inexpensive compared to that of alumina, materials cost is reduced while ensuring the moisture resistance of the first resin encapsulant 2A. It should be noted that in the first resin encapsulant 2A, since importance is placed on moisture resistance, the filler content can also be reduced. In this case, the hard filler less frequently collides against the circuit elements and the fine metal wires at the time of resin injection. Thus, damage to circuit elements and the like are reduced.

Next, the second resin encapsulant 2B is formed by melting the resin sheet 13. The circuit board 4 sinks into the resin of the melted resin sheet 13, causing the second resin encapsulant 2B to cover the lower surface side of the circuit board 4. Further details will be described later. In other words, unlike the first resin encapsulant 2A, the resin forming the second resin encapsulant 2B does not need to flow through a gap of, for example, approximately 0.3 mm between the lower surface of the circuit board 4 and an inner wall of a lower mold half 22. Accordingly, filler having a particle size of up to approximately 150 μm is used as the filler contained in the resin forming the second resin encapsulant 2B. In other words, in the second resin encapsulant 2B, since filler having a larger particle size than that of the first resin encapsulant 2A is used, the thermal resistance in the second resin encapsulant 2B is greatly reduced, and heat dissipation from the lower surface side of the circuit board 4 is greatly improved. It should be noted that since the resin forming the second resin encapsulant 2B hardly flows at all as described previously, the entire region of the second resin encapsulant 2B is relatively uniformly filled with the filler. This structure makes the thermal resistance of the second resin encapsulant 2B uniform over the entire region thereof.

Further, the second resin encapsulant 2B is intended to mainly cover from the lower surface side of the circuit board 4 to an upper portion of the side surfaces thereof, and is formed not to move around to the upper surface side of the circuit board 4. Accordingly, as described previously, no consideration needs to be given to problems such as damage to the circuit elements and breakage of the fine metal wires, and filler having a polygonal shape such as crystalline filler or crushed filler is used as the filler. Since the filler shape is a polygonal shape, the surface area of the filler increases, the contact area between the filler and the resin increases, thermal conductivity through the filler becomes favorable, and the thermal resistance in the second resin encapsulant 2B is greatly reduced. This structure realizes excellent heat dissipation not only from the lower surface side of the circuit board 4 but also from the side surface side thereof in the circuit device 1, and greatly improves the total heat dissipation of the circuit device 1. It should be noted that increasing the amount of the filler contained in the second resin encapsulant 2B to an amount larger than that of the filler contained in the first resin encapsulant 2A also reduces the thermal resistance in the second resin encapsulant 2B.

Further, the second resin encapsulant 2B is required to have heat dissipation rather than moisture resistance. Thus, alumina, which has an excellent thermal conductivity of 2.1 W/m·K, is used as the filler contained in the second resin encapsulant 2B. Since the second resin encapsulant 2B contains alumina, the second resin encapsulant 2B becomes porous to exhibit high moisture absorption. However, this is not particularly a problem because circuit elements, fine metal wires, and the like are not disposed on the lower surface side and side surface side of the circuit board 4. It should be noted that as described previously, as the filler contained in the second resin encapsulant 2B, crystalline silica, crushed silica, fused silica, or silicon nitride may be used to be mixed with alumina.

As described previously, alumina, which has an excellent thermal conductivity, is used in the second resin encapsulant 2B. Alumina having a polygonal shape such as crystalline alumina or crushed alumina is used. Accordingly, disposing the second resin encapsulant 2B such that the side surfaces of the circuit board 4 are covered as high as possible under conditions in which the second resin encapsulant 2B does not move around to the upper surface side of the circuit board 4, solves the aforementioned problem of short circuits, and improves the heat dissipation of the circuit device 1. In other words, the range of the side surfaces of the circuit board 4 which is covered with the second resin encapsulant 2B is adjusted in a range in which the moisture resistance of the upper surface side of the circuit board 4 can be ensured.

It should be noted that though a description has been made in this embodiment for the case where the resin sheet 13 placed under the lower surface of the circuit board 4 is melted and thermally cured to form the second resin encapsulant 2B, the present invention is not limited to this case. For example, similar to the first resin encapsulant 2A, the second resin encapsulant 2B may be formed by other manufacturing method such as the injection of resin into a resin encapsulation mold or potting. In other words, as described previously, it is enough to reduce the thermal resistance of the second resin encapsulant 2B and to improve heat dissipation from the lower surface side of the circuit board 4 and the side surface side thereof. Other various modifications can be made without departing from the spirit of the present invention.

Figure 3A:
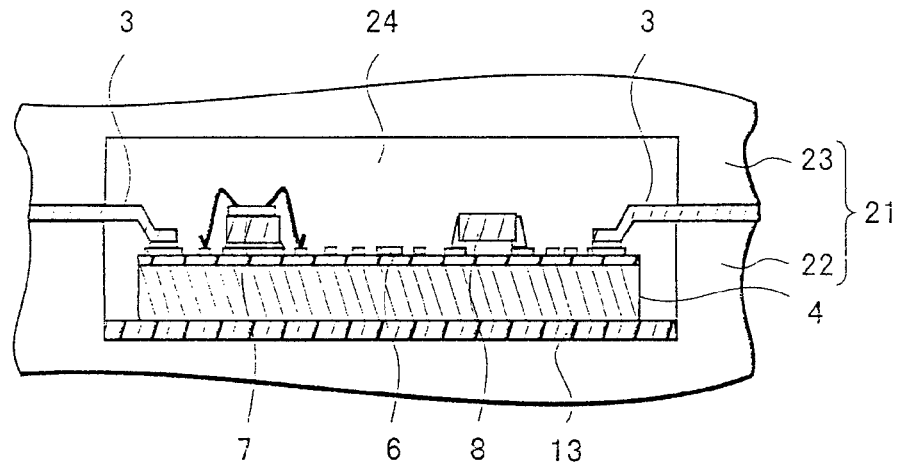
FIGS. 3A to 3C are cross-sectional views for explaining a method of manufacturing a circuit device in an embodiment of the present invention.
Figure 3B:
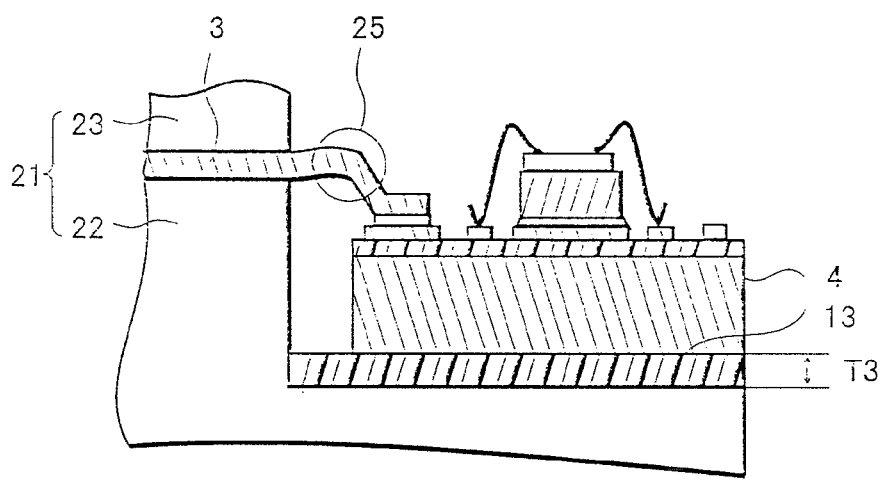
Figure 3C:
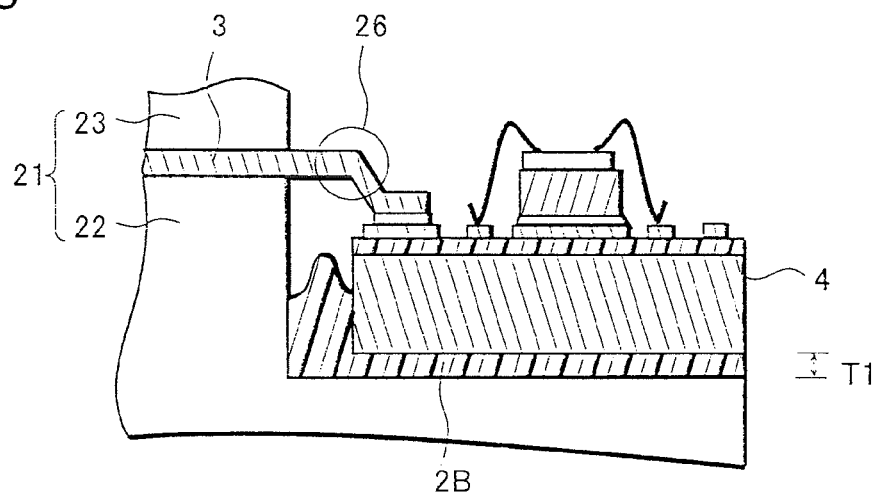
Figure 4A:
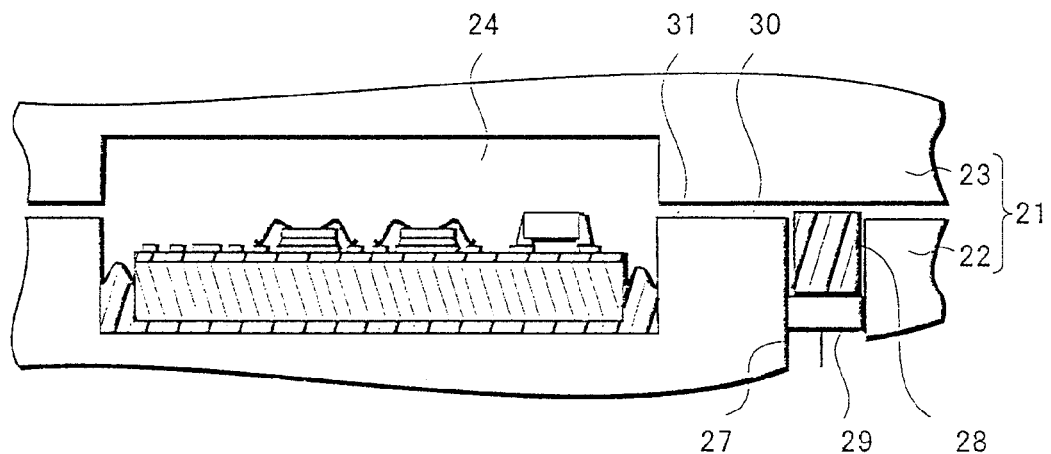
FIGS. 4A and 4B are cross-sectional views for explaining the method of manufacturing a circuit device in the embodiment of the present invention.
Figure 4B:
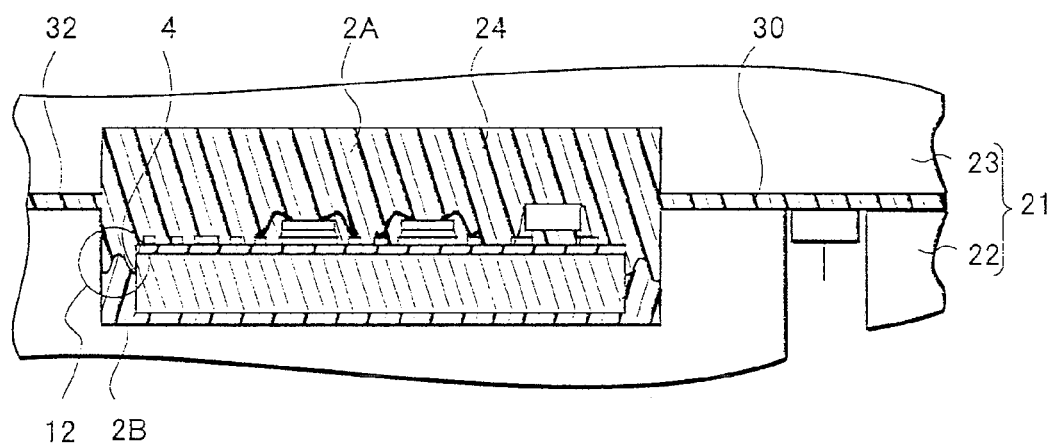

Next, a method of manufacturing a circuit device according to a second embodiment of the present invention will be described. FIGS. 3A to 3C are cross-sectional views for explaining a state in which a circuit board is placed in a resin encapsulation mold. FIGS. 4A and 4B are cross-sectional views for explaining a state in which resin is injected into the resin encapsulation mold. It should be noted that in this embodiment, since a method of manufacturing the circuit device described with reference to FIGS. 1A to 2B will be described, the same components are denoted by the same reference numerals, and FIGS. 1A to 2B are appropriately referenced.

As shown in FIG. 3A, first, the circuit board 4 is prepared, and the insulating layer 5 is formed on the circuit board 4. By attaching a metal film of, for example, copper to the upper surface of the insulating layer 5 and etching the metal film into a desired pattern, the conductive pattern 6 and the pads 11 are formed on the circuit board 4. Further, a large number of semiconductor elements 7 and chip elements 8 are fixed at desired positions on the conductive pattern 6, and the leads 3 are fixed on the pads 11.

Next, the resin sheet 13 is mounted on the upper surface of the inner wall of the lower mold half 22 of the resin encapsulation mold 21, and then the circuit board 4 is mounted on the upper surface of this resin sheet 13. Further, an upper mold half 23 and the lower mold half 22 are brought into contact with each other to clamp the leads 3 between the upper and lower mold halves 23 and 22. Thus, the position of the circuit board 4 is fixed in a cavity 24. It should be noted that at a stage prior to heat treatment after the placement in the resin encapsulation mold 21, the resin sheet 13 is in a solid state obtained by molding a granular thermosetting resin by compression molding as described previously.

As shown in FIG. 3B, the thickness T3 of the resin sheet 13 is, for example, approximately 0.8 mm. Thus, the resin sheet 13 is formed to have a thickness larger than the thickness T1 (see FIG. 1B) of the resin encapsulant 2 covering the lower surface side of the circuit board 4 of the circuit device 1.

On the other hand, as described previously, the circuit board 4 in the cavity 24 comes into a state in which the leads 3 are clamped between the upper and lower mold halves 23 and 22, and in which the position of the lower surface of the circuit board 4 is fixed at a position separated from the upper surface of the inner wall of the lower mold half 22 by T1. Accordingly, when the leads 3 are clamped by the resin encapsulation mold 21 in a state in which the circuit board 4 is mounted on the upper surface of the resin sheet 13, the leads 3 are elastically deformed as indicated by a circle 25. Further, the circuit board 4 presses the resin sheet 13 against the lower mold half 22 to bring the resin sheet 13 into a fixed state.

As shown in FIG. 3C, the resin encapsulation mold 21 is equipped with a heater system (not shown), and the resin encapsulation mold 21 is heated by the heater system to a temperature (e.g., 170° C. or higher) at which the resin sheet 13 is melted and thermally cured. Further, the positions of the resin sheet 13 and the circuit board 4 are fixed in the cavity 24, and then the resin encapsulation mold 21 is heated. Thus, the resin sheet 13 is melted and softened with the elapse of time.

As described previously, the leads 3 are clamped by the resin encapsulation mold 21 in an elastically deformed state. Accordingly, when the resin sheet 13 is melted, the leads 3 return to original shapes as indicated by a circle 26, and the circuit board 4 sinks into the melted resin. Further, with the sinking of the circuit board 4, the melted resin moves from a region under the circuit board 4 to a region beside the circuit board 4 to cure. Thus, the second resin encapsulant 2B covers from the lower surface of the circuit board 4 to the vicinities of upper portions of the side surfaces thereof. At this time, the resin sheet 13 is formed to have a two-dimensional size larger than that of the circuit board 4. Accordingly, the second resin encapsulant 2B reliably covers to the lower surface of the circuit board 4. Moreover, since the melted resin is moved from a region under the circuit board 4 to a region beside the circuit board 4, the occurrence of voids under the lower surface of the circuit board 4 is reduced.

As shown in FIG. 4A, a tablet 28 is dropped into a pod 27 provided in the lower mold half 22 to be heated and melted, and then the tablet 28 is pressed using a plunger 29. The tablet 28 is a product obtained by molding a powdery thermosetting resin (epoxy resin, ortho-cresol novolac/biphenyl, dicyclopentadiene, or the like) having an additive such as filler mixed therein into a columnar shape by compression molding. The resin encapsulation mold 21 is heated to approximately 170° C. or higher as described previously. Accordingly, when the tablet 28 is dropped into the pod 27, the tablet 28 is gradually melted. Further, the tablet 28 is melted into a liquid or semi-solid state to flow through a runner 30 and pass through a gate 31, thus being supplied into the cavity 24.

As shown in FIG. 4B, the cavity 24 is filled with the resin obtained by the melting of the tablet 28. At this time, since the temperature of the resin encapsulation mold 21 is higher than the temperature at which the melted resin is thermally cured, the resin filling the cavity 24 polymerizes and cures with the elapse of time.

Here, in this step, for example, by adjusting the work sequence of the step and the formulation of resins, the second resin encapsulant 2B is thermally cured before the first resin encapsulant 2A. Since this step causes the second resin encapsulant 2B to first cure integrally with the circuit board 4, the circuit board 4 is prevented from being warped by the shrinkage force produced when the first resin encapsulant 2A cures. Moreover, since the first resin encapsulant 2A is supplied into the cavity 24 in a liquid state, the thermal curing of the first resin encapsulant 2A proceeds under pressure from the plunger 29. As a result, as indicated by the circles 12, at a boundary surface between the first resin encapsulant 2A and the second resin encapsulant 2B, pressure is applied from the first resin encapsulant 2A to the side of the second resin encapsulant 2B. This facilitates the polymerization of the resin encapsulants 2A and 2B, and improves the degree of integration thereof. Thus, moisture resistance in this polymerized region is ensured.

Finally, when the first resin encapsulant 2A and the second resin encapsulant 2B sufficiently polymerize and thermally cure in the resin encapsulation mold 21, the upper mold half 23 and the lower mold half 22 are separated, and the circuit device 1 as a molded product is taken out. Then, portions of the cured resin which fill an air vent 32, the runner 30, and the like are cut off from the resin encapsulant 2, and outer lead portions of the leads are processed. Thus, the circuit device shown in FIGS. 1A and 1B is completed.

Figure 5A:
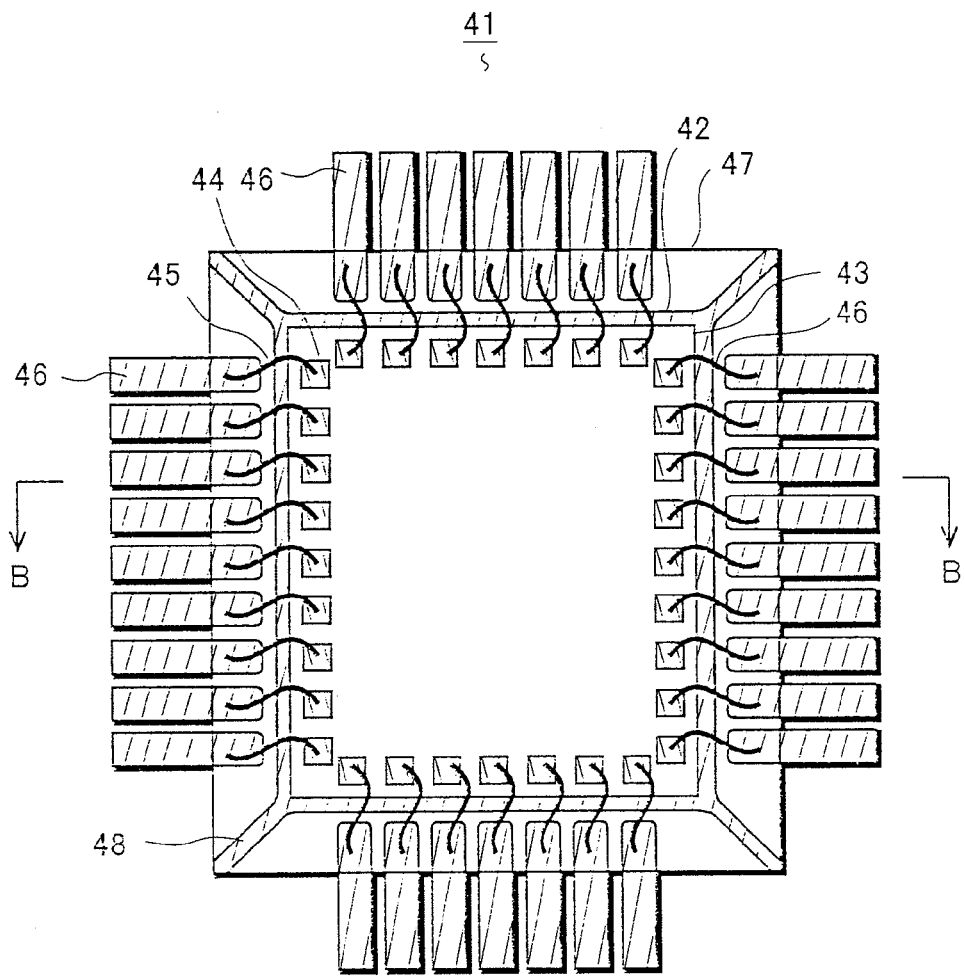
FIGS. 5A and 5B are a plan view and a cross-sectional view for explaining a semiconductor device in an embodiment of the present invention, respectively.
Figure 5B:
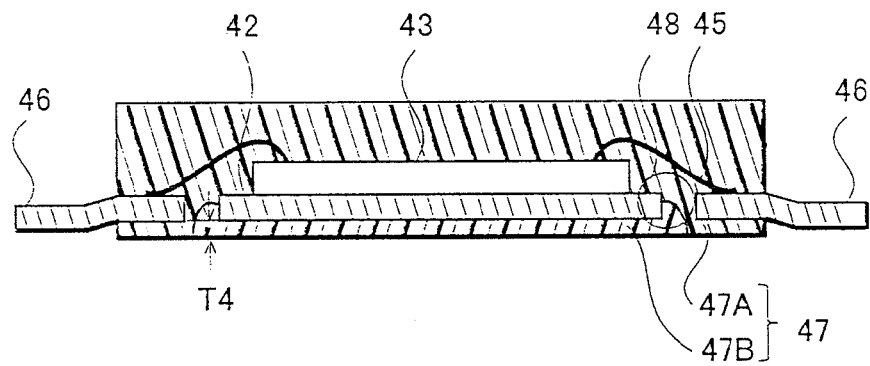

Next, a semiconductor device according to a third embodiment of the present invention will be described. FIG. 5B is a cross-sectional view of a semiconductor device shown in FIG. 5A, which is taken along line B-B. It should be noted that portions which are invisible due to the presence of a resin encapsulant are also shown in FIG. 5A, and will be described. Moreover, in the explanation thereof, the explanation of FIGS. 1A to 2B will be appropriately taken into consideration.

As shown in FIG. 5A, a semiconductor device 41 mainly includes an island 42, a semiconductor element 43 fixed on the island 42 with an adhesive such as solder, leads 46 electrically connected to electrode pads 44 of the semiconductor element 43 with fine metal wires 45, and a resin encapsulant 47 integrally covering the foregoing components. As shown in the drawing, support leads 48 extend from four corners of the island 42 outward. The island 42 is mechanically supported by these support leads 48 to be continuous with a frame.

As shown in FIG. 5B, the resin encapsulant 47 includes a first resin encapsulant 47A and a second resin encapsulant 47B. In the drawing plane, a boundary between the first resin encapsulant 47A and the second resin encapsulant 47B is drawn. However, in the actual semiconductor device 41, the resin encapsulants 47A and 47B polymerize to be integrated. Further, the first resin encapsulant 47A is formed by injecting melted resin into the cavity of the resin encapsulation mold, and the second resin encapsulant 47B is formed by melting the resin sheet 13 (see FIG. 2A) placed under the lower surface of the island 42. The second resin encapsulant 47B has a thickness T4 of, for example, not less than 0.1 mm nor more than 0.3 mm to form a very thin film. Thus, thermal resistance in the second resin encapsulant 47B is reduced.

Further, the composition of the resin constituting the first resin encapsulant 47A is the same as that of the first resin encapsulant 2A, and the composition of the resin constituting the second resin encapsulant 47B is the same as that of the second resin encapsulant 2B. With regard to the explanation thereof, the explanation of FIGS. 1A to 2B in the first embodiment will be taken into consideration, and the explanation thereof will be omitted here. Further, as indicated by a circle 48, in the semiconductor device 41, also, the second resin encapsulant 47B covers from the lower surface of the island 42 to an upper portion of the side surfaces thereof. Further, since the second resin encapsulant 47B under the lower surface of the island 42 is a thin film, the thermal resistance of the second resin encapsulant 47B is reduced. Thus, heat radiated from the semiconductor element 43 is favorably radiated outside the semiconductor device 41 through the island 42 and the second resin encapsulant 47B.

It should be noted that though a description has been made in this embodiment for the case where the resin sheet 13 placed under the lower surface of the island 42 is melted and thermally cured to form the second resin encapsulant 47B, the present invention is not limited to this case. For example, similar to the first resin encapsulant 47A, the second resin encapsulant 47B may be formed by other manufacturing method such as the injection of resin into a resin encapsulation mold or potting. In other words, as described previously, it is enough to reduce the thermal resistance of the second resin encapsulant 47B and to improve heat dissipation from the lower surface side of the island 42. Other various modifications can be made without departing from the spirit of the present invention.

Figure 6A:
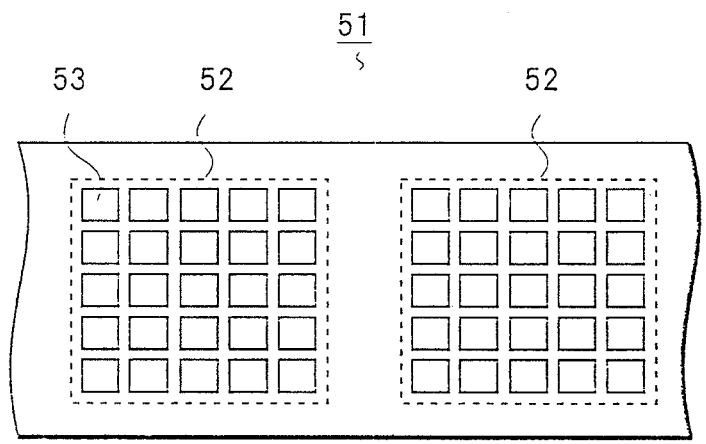
FIGS. 6A and 6B are plan views for explaining a method of manufacturing a semiconductor device in an embodiment of the present invention.
Figure 6B:
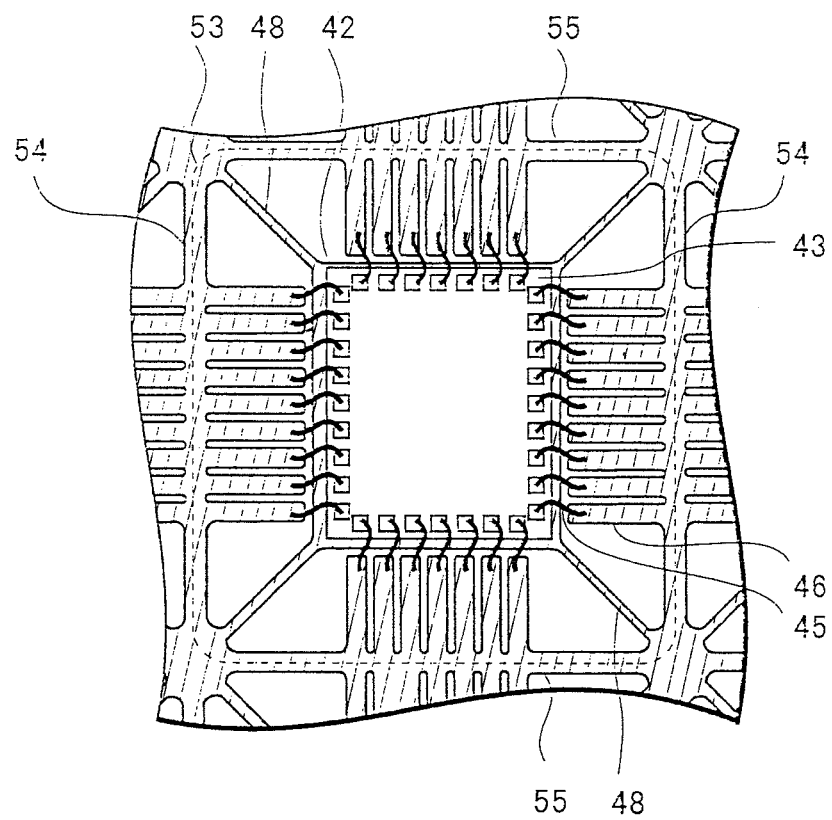
Figure 7A:
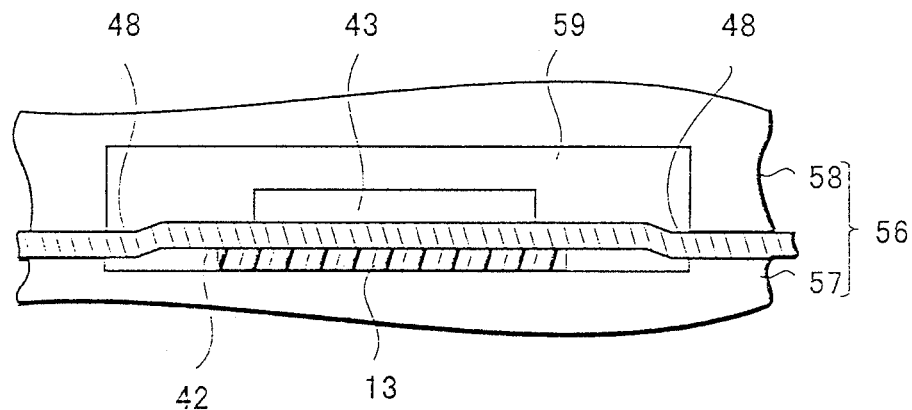
FIGS. 7A to 7C are cross-sectional views for explaining the method of manufacturing a semiconductor device in the embodiment of the present invention.
Figure 7B:
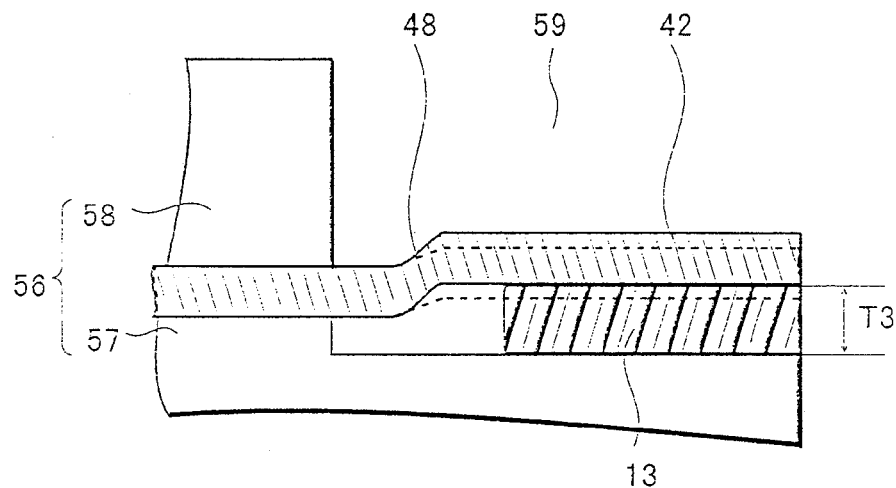
Figure 7C:
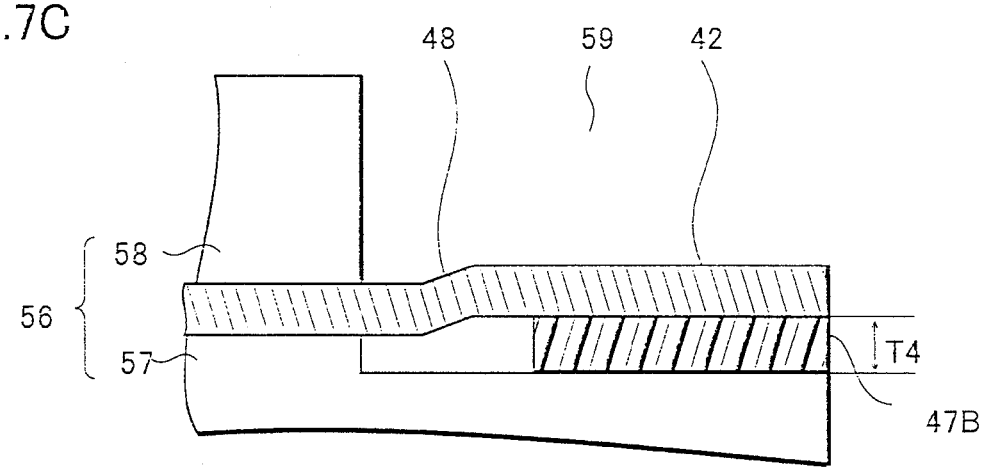
Figure 8A:
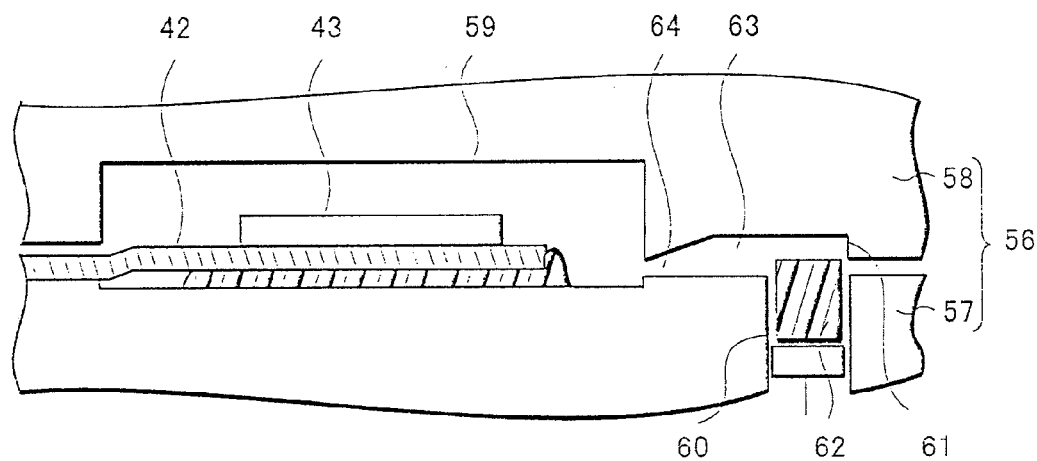
FIGS. 8A and 8B are cross-sectional views for explaining the method of manufacturing a semiconductor device in the embodiment of the present invention.
Figure 8B:
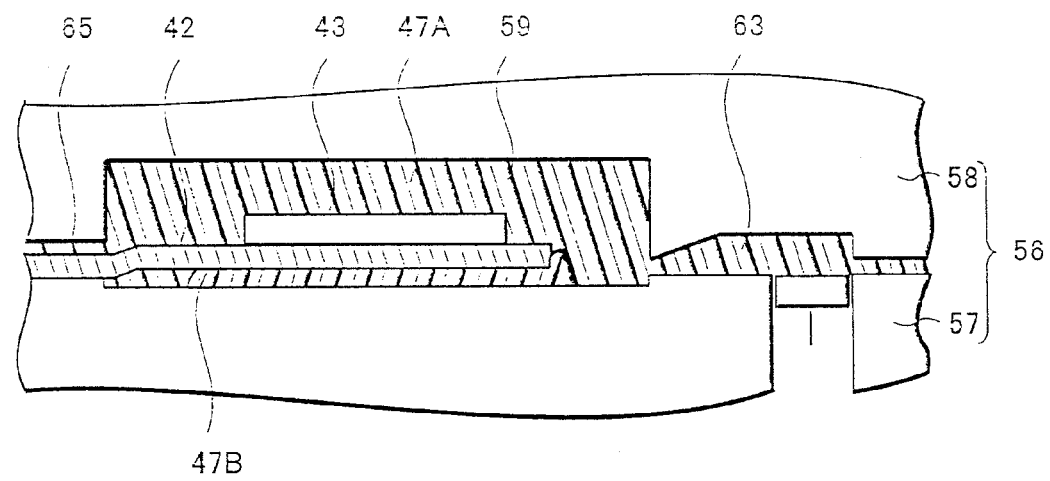
Figure 9A:
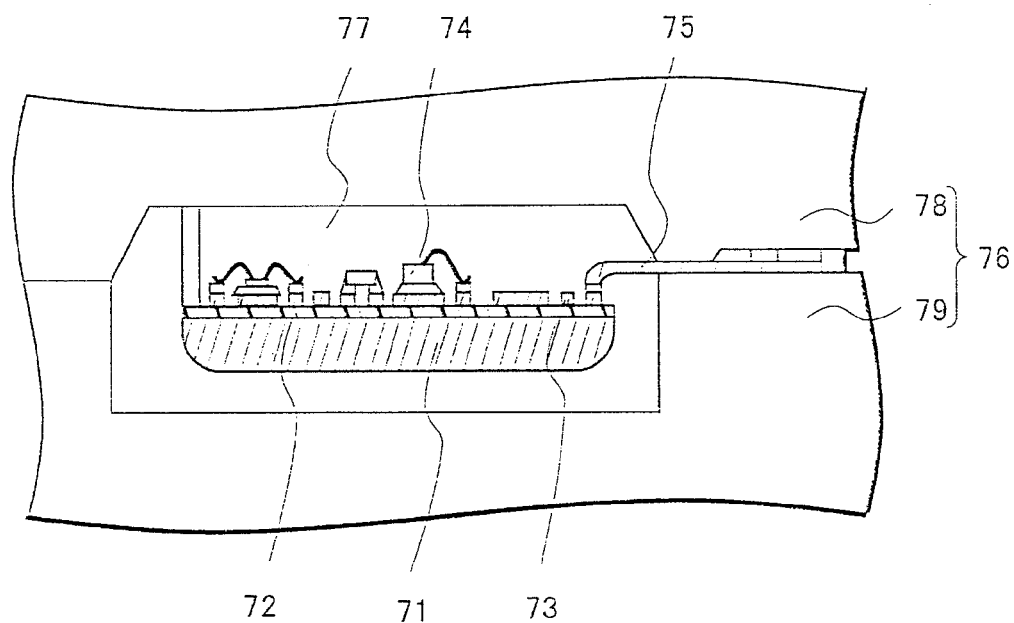
FIGS. 9A and 9B are cross-sectional views for explaining a circuit device in a conventional embodiment and a method of manufacturing the same.
Figure 9B:
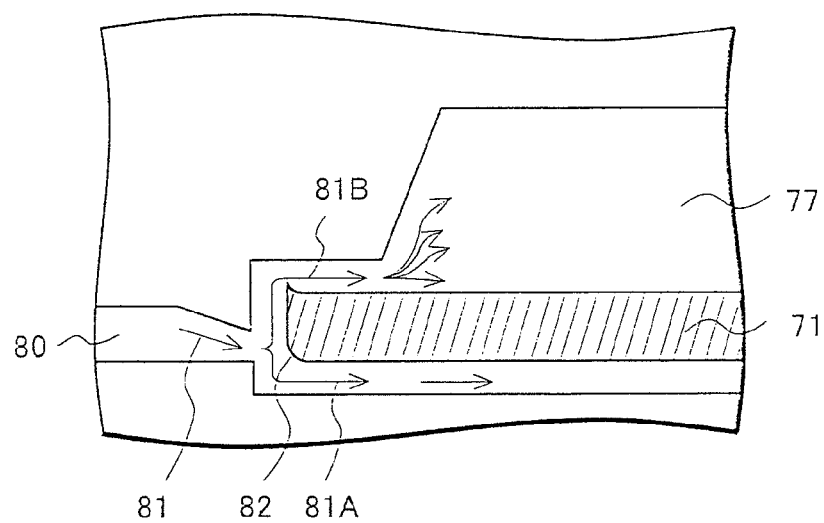
Figure 10:
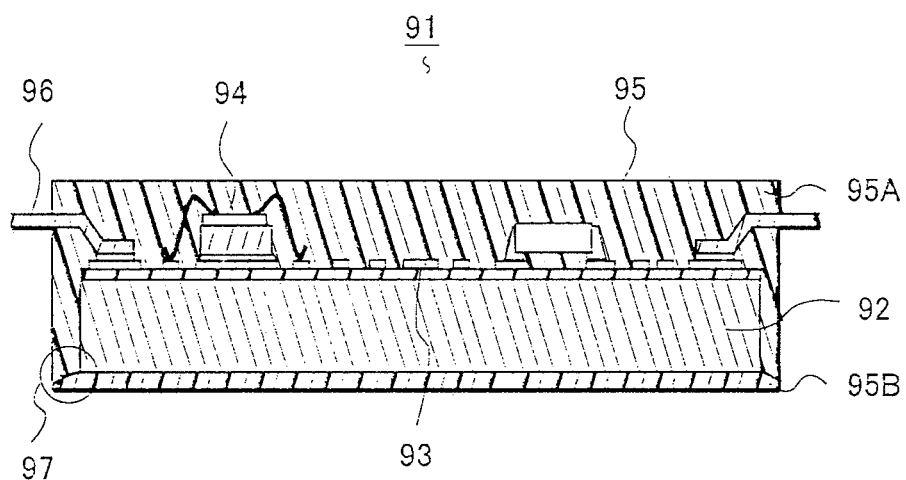
FIG. 10 is a cross-sectional view for explaining a circuit device in a conventional embodiment.

Next, a method of manufacturing a semiconductor device according to a fourth embodiment of the present invention will be described. FIGS. 6A and 6B are plan views for explaining a die bonding step and a wire bonding step. FIGS. 7A to 7C are cross-sectional views for explaining a state in which a frame is placed in a resin encapsulation mold. FIGS. 8A and 8B are cross-sectional views for explaining a state in which resin is injected into the resin encapsulation mold. It should be noted that in this embodiment, since a method of manufacturing the semiconductor device described with reference to FIGS. 5A and 5B will be described, the same components are denoted by the same reference numerals. Moreover, in the explanation thereof, the explanation of FIGS. 3A to 4B will be taken into consideration.

As shown in FIG. 6A, first, a lead frame 51 having a predetermined shape is prepared. The lead frame 51 is made of a metal plate of copper or the like having a thickness of, for example, approximately 0.3 mm, and is formed into a predetermined shape by etching or press working. Further, the lead frame 51 has the shape of a strip as a whole, and a plurality of collective blocks 52 indicated by dotted lines are disposed in the longitudinal direction of the lead frame 51. In each of the collective blocks 52, a plurality of mount portions 53 are formed.

As shown in FIG. 6B, in the collective block 52, connecting portions 54 and 55 extend in the faun of a grid in the horizontal and vertical directions, and a mount portion 53 is formed in each of regions surrounded by the connecting portions 54 and 55 as indicated by a dotted line. Further, for each of the mount portions 53, the semiconductor element 43 is fixed on the island 42 with an adhesive, and the electrode pads 44 of the semiconductor element 43 and the leads 46 are electrically connected to each other with the fine metal wires 45.

As shown in FIG. 7A, the resin sheet 13 is mounted on the upper surface of the inner wall of a lower mold half 57 of a resin encapsulation mold 56, and then the island 42 is mounted on the upper surface of this resin sheet 13. Further, an upper mold half 58 and the lower mold half 57 are brought into contact with each other to place the mount portion 53 (see FIG. 6B) including the island 42 in a cavity 59. As shown in the drawing, the support leads 48 are clamped between the upper and lower mold halves 58 and 57. Thus, the position of the island 42 in the cavity 59 is fixed. It should be noted that at a stage prior to heat treatment after the placement in the resin encapsulation mold 56, as described previously, the resin sheet 13 is in a solid state obtained by molding a granular thermosetting resin by compression molding as described previously.

As shown in FIG. 7B, the thickness T3 of the resin sheet 13 is, for example, approximately 0.8 mm. Thus, the resin sheet 13 is formed to have a thickness larger than the thickness T4 (see FIG. 7C) of the resin encapsulant 47 covering the lower surface side of the island 42.

On the other hand, as described previously, the island 42 in the cavity 59 comes into the state in which the support leads 48 are clamped between the upper and lower mold halves 58 and 57, and in which the position of the lower surface of the island 42 is fixed at a position separated from the upper surface of the inner wall of the lower mold half 57 by T3. Accordingly, when the support leads 48 are clamped by the resin encapsulation mold 56 in a state in which the island 42 is mounted on the upper surface of the resin sheet 13, the support leads 48 are elastically deformed, and the resin sheet 13 is fixed in place in the state of being pressed against the lower mold half 57 by the island 42. It should be noted that dotted lines indicate a state in which the support leads 48 are not deformed.

As shown in FIG. 7C, the resin encapsulation mold 56 is equipped with a heater system (not shown), and the resin encapsulation mold 56 is heated by the heater system to a temperature (e.g., 170° C. or higher) at which the resin sheet 13 is melted and thermally cured. Further, the positions of the resin sheet 13 and the island 42 are fixed in the cavity 59, and then the resin encapsulation mold 56 is heated. Thus, the resin sheet 13 is melted and softened with the elapse of time, and the lower surface of the island 42 is covered with the melted resin. It should be noted that the second resin encapsulant 47B has a thickness T4 of, for example, not less than 0.1 mm nor more than 0.3 mm to form a very thin film, and that the thermal resistance in the second resin encapsulant 47B is reduced.

As shown in the drawing, when the resin sheet 13 is melted, the support leads 48 return to original shapes, and the island 42 sinks downward. Further, with the sinking of the island 42, part of the melted resin moves from a region under the island 42 to a region beside the island 42, and the second resin encapsulant 47B covers from the lower surface of the island 42 to upper portions of the side surfaces thereof.

As shown in FIG. 8A, a tablet 61 is dropped into a pod 60 provided in the lower mold half 57 to be heated and melted, and then the tablet 61 is pressed using a plunger 62. The tablet 61 is a product obtained by molding a powdery thermosetting resin (epoxy resin, ortho-cresol novolac/biphenyl, dicyclopentadiene, or the like) having an additive such as filler mixed therein into a columnar shape by compression molding. The resin encapsulation mold 56 is heated to approximately 170° C. or higher as described previously. Accordingly, when the tablet 61 is dropped into the pod 60, the tablet 61 is gradually melted. Further, the tablet 61 is melted into a liquid or semi-solid state to flow through a runner 63 and pass through a gate 64, thus being supplied into the cavity 59.

As shown in FIG. 8B, the cavity 59 is filled with the resin obtained by the melting of the tablet 61. At this time, since the temperature of the resin encapsulation mold 56 is higher than the temperature at which the melted resin is thermally cured, the resin filling the cavity 24 polymerize and cure with the elapse of time. It should be noted that as described with reference to FIG. 4B previously, the boundary surface between the first resin encapsulant 47A and the second resin encapsulant 47B polymerizes to integrally cure.

Finally, when the first resin encapsulant 47A and the second resin encapsulant 47B sufficiently polymerize and thermally cure in the resin encapsulation mold 56, the upper mold half 58 and the lower mold half 57 are separated, and the semiconductor device 41 as a molded product is taken out. Then, portions of the cured resin which fill an air vent 65, the runner 63, and the like are cut off from the resin encapsulant 47, and outer lead portions of the leads are processed. Thus, the semiconductor device shown in FIG. 5A is completed.

In the preferred embodiments, the resin encapsulant includes two types of encapsulating resins, and the polymerized region of the encapsulating resins is located on the side surfaces of the circuit board. Thus, the withstand voltage characteristic is improved, and the circuit board is prevented from being short-circuited.

Moreover, in the preferred embodiments, the particle size of the filler of the encapsulating resin covering from the lower surface side of the circuit board to the upper portion of the side surfaces thereof is larger than the particle size of the filler of the encapsulating resin covering the upper surface side of the circuit board. Thus, heat dissipation to the outside of the circuit device is improved.

Moreover, in the preferred embodiments, the structure is employed in which circuit elements and the like are not disposed on the lower surface side of the circuit board, and alumina is used as the filler in the resin on the lower surface side of the circuit board. Thus, the thermal resistance of the resin containing the filler is greatly reduced.

Moreover, in the preferred embodiments, the resin on the lower surface side of the circuit board is formed by using the resin sheet. Thus, the particle size of the filler contained in the resin becomes large, and heat dissipation to the outside of the circuit device is improved.

Moreover, in the preferred embodiments, the shape of the filler disposed on the lower surface side of the circuit board is the polygonal shape. Thus, the thermal resistance of the resin containing the filler is greatly reduced.

Moreover, in the preferred embodiments, silica is used as the filler in the resin on the upper surface side of the circuit board in which importance is placed on moisture resistance. Thus, materials cost is greatly reduced.

Moreover, in the preferred embodiments, the encapsulating resin covering from the lower surface side of the circuit board to the upper portion of the side surface thereof is cured before the encapsulating resin covering the upper surface side of the circuit board. Thus, the warpage of the circuit board can be prevented.

What is claimed is:

1. A circuit device comprising:
    a circuit board having a first main surface, a second main surface opposite from the first main surface and a side surface connecting the first and second main surfaces;
    a conductive pattern disposed on the first main surface of the circuit board;
    a circuit element disposed on the conductive pattern; and
    a resin encapsulant covering the circuit board and comprising a first resin encapsulant covering at least the first main surface of the circuit board and part of the side surface of the circuit board and a second resin encapsulant covering at least the second main surface of the circuit board and part of the side surface of the circuit board,
    wherein a polymerized region of the first resin encapsulant and the second resin encapsulant is formed beside the side surface of the circuit board, and the polymerized region is located closer to the first main surface than to the second main surface so that a top portion of the polymerized region is located at a position lower than the first main surface of the circuit board.

2. The circuit device according to claim 1, wherein a particle size of filler contained in the second resin encapsulant is larger than a particle size of filler contained in the first resin encapsulant.

3. The circuit device according to claim 2, wherein material properties of the filler contained in the second resin encapsulant is different from material properties of the filler contained in the first resin encapsulant, and a thermal conductivity of the filler contained in the second resin encapsulant is larger than a thermal conductivity of the filler contained in the first resin encapsulant.

4. The circuit device according to any one of claims 2 or 3, wherein the second resin encapsulant is made of a resin obtained by melting and curing a resin sheet formed by pressing a powdered resin and disposed under the second main surface of the circuit board.

5. The circuit device according to claim 2, wherein a shape of the filler contained in the second resin encapsulant is any one of a crystalline shape and a crushed shape.

6. The circuit device according to claim 3, wherein a shape of the filler contained in the second resin encapsulant is any one of a crystalline shape and a crushed shape.

7. The circuit device according to claim 2, wherein the filler contained in the first resin encapsulant is spherical silica, and the filler contained in the second resin encapsulant is alumina.

8. The circuit device according to claim 3, wherein the filler contained in the first resin encapsulant is spherical silica, and the filler contained in the second resin encapsulant is alumina.

9. The circuit device according to claim 4, wherein the filler contained in the first resin encapsulant is spherical silica, and the filler contained in the second resin encapsulant is alumina.

10. The circuit device according to claim 5, wherein the filler contained in the first resin encapsulant is spherical silica, and the filler contained in the second resin encapsulant is alumina.

11. The circuit device according to claim 1, wherein the circuit board comprises a substrate and an insulating layer disposed on the substrate, and the conductive pattern is disposed on the insulating layer.

* * * * *